(12) United States Patent
Shigeta et al.

(10) Patent No.: US 10,397,499 B2
(45) Date of Patent: Aug. 27, 2019

(54) IMAGING DEVICE, IMAGING SYSTEM, AND METHOD FOR DRIVING IMAGING DEVICE FOR CAPTURING AN IMAGE WITH A RESTRAINED INFLUENCE OF A BLINKING STATE OF A LIGHT SOURCE

(71) Applicant: CANON KABUSHIKI KAISHA, Tokyo (JP)

(72) Inventors: Kazuyuki Shigeta, Yokohama (JP); Noriyuki Kaifu, Atsugi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 15/363,849

(22) Filed: Nov. 29, 2016

(65) Prior Publication Data

US 2017/0163913 A1    Jun. 8, 2017

(30) Foreign Application Priority Data

Dec. 4, 2015    (JP) ................................. 2015-237864

(51) Int. Cl.
*H04N 5/225* (2006.01)
*H04N 5/232* (2006.01)
(Continued)

(52) U.S. Cl.
CPC ..... *H04N 5/3537* (2013.01); *H01L 27/14612* (2013.01); *H01L 27/14656* (2013.01); *H04N 5/2357* (2013.01); *H04N 5/353* (2013.01); *H04N 5/3532* (2013.01); *H04N 5/3535* (2013.01); *H04N 5/35536* (2013.01); *H04N 5/35581* (2013.01); *H04N 5/378* (2013.01); *H04N 5/3745* (2013.01); *H04N 5/37452* (2013.01); *H04N 5/2256* (2013.01); *H04N 5/23293* (2013.01)

(58) Field of Classification Search
CPC .. H04N 5/2353; H04N 5/3532; H04N 5/2357; H04N 5/3535; H04N 5/35554; G01S 5/16
See application file for complete search history.

(56) References Cited

U.S. PATENT DOCUMENTS 7,414,233 B2 *  8/2008  Asaba .................... H04N 5/361
                                                         250/208.1
8,085,321 B2 * 12/2011  Xu ...................... H01L 27/14609
                                                         250/208.1
(Continued)

FOREIGN PATENT DOCUMENTS

WO         2011043432 A1     4/2011

*Primary Examiner* — Gevell V Selby
(74) *Attorney, Agent, or Firm* — Canon U.S.A., Inc. IP Division

(57) ABSTRACT

There is provided an imaging device configured to acquire an image with the restrained influence of the blinking state of a light source while ensuring synchronicity of charge accumulation. For a plurality of pixels arranged in a plurality of rows, the imaging device intermittently turns on a first transfer switch at a same timing a plurality of times to transfer electric charges from a photoelectric conversion unit to a holding unit a plurality of times. The imaging device row-sequentially turns on a second transfer switch of the plurality of pixels to transfer electric charges transferred a plurality of times to and held by the holding unit, to an amplifying unit on a row basis.

16 Claims, 10 Drawing Sheets

(51) Int. Cl.
   *H04N 5/235*    (2006.01)
   *H04N 5/353*    (2011.01)
   *H04N 5/355*    (2011.01)
   *H04N 5/378*    (2011.01)
   *H01L 27/146*   (2006.01)
   *H04N 5/3745*   (2011.01)

(56) References Cited

U.S. PATENT DOCUMENTS

| | | |
|---|---|---|
| 2005/0110885 A1* | 5/2005 | Altice, Jr. ............... H04N 5/363 348/308 |
| 2006/0011810 A1 | 1/2006 | Ando |
| 2008/0158398 A1 | 7/2008 | Yaffe |
| 2010/0165167 A1 | 7/2010 | Sugiyama et al. |
| 2013/0044247 A1 | 2/2013 | Kawahito |
| 2013/0135486 A1 | 5/2013 | Wan |
| 2014/0247378 A1 | 9/2014 | Sharma |
| 2015/0244950 A1 | 8/2015 | Johnson |
| 2016/0182839 A1 | 6/2016 | Shigeta |

* cited by examiner

IMAGING DEVICE, IMAGING SYSTEM, AND METHOD FOR DRIVING IMAGING DEVICE FOR CAPTURING AN IMAGE WITH A RESTRAINED INFLUENCE OF A BLINKING STATE OF A LIGHT SOURCE

BACKGROUND OF THE INVENTION

Field of the Invention

The present invention relates to an imaging device, an imaging system, and a method for driving the imaging device.

Description of the Related Art

In recent years, digital video cameras, digital cameras, and other imaging apparatuses including a Complementary Metal Oxide Semiconductor (CMOS) image sensor suitable for low power consumption and high-speed readout have been widely used. When a subject is moving relative to an imaging apparatus, if exposure within the imaging region is not performed at the same timing, the charge accumulation time differs for each scanning line and the recorded subject may contain distortions. There has been proposed a configuration in which the start and the end of exposure are controlled at the same timing for all pixels (referred to as a global electronic shutter) to ensure synchronicity of charge accumulation (see International Unexamined patent application Ser. No. 11/043,432).

Although some of light emitting diode (LED) light sources and fluorescent light sources used for traffic signals and electric bulletin boards appear to be lighting up with constant brightness to human eyes, these light sources are actually blinking at high frequencies in synchronization with the frequency of a commercial power supply. Further, in some light sources operating on direct current (DC) power, the luminance is controlled based on a pulse-driven method such as Pulse Width Modulation (PWM) to restrain the current consumption and control the brightness.

When an image is captured with a short exposure time under a light source, a still image may be captured as if the light source is not lighting up and a moving image may be captured as if the light source is frequently blinking because of varying luminance values of images between frames. When an image is captured in a short exposure time compared to the lighting cycle of the light source, there may arise phenomena such as screen flickers in which the luminance changes for each frame in an imaging scene with uniform brightness and line flickers in which bright and dark portions periodically occur in an imaging screen.

SUMMARY OF THE INVENTION

The present invention is directed to an imaging device capable of capturing an image with the restrained influence of the blinking state of a light source while ensuring synchronicity of charge accumulation, and also to an imaging system and a method for driving the imaging device.

According to an aspect of the present invention, an imaging device includes a plurality of pixels each including a photoelectric conversion unit configured to accumulate electric charges generated by incident light, a holding unit configured to hold the electric charges, an amplifying unit configured to output a signal based on the electric charges, a first transfer switch configured to transfer the electric charges from the photoelectric conversion unit to the holding unit, and a second transfer switch configured to transfer the electric charges from the holding unit to the amplifying unit, output lines configured to output signals from the amplifying unit of the plurality of pixels, and a control unit configured to, for each of the plurality of pixels arranged in a plurality of rows from among the plurality of pixels, perform control to intermittently turn on the first transfer switch at the same timing a plurality of times to transfer the electric charges from the photoelectric conversion unit to the holding unit a plurality of times, and perform control to row-sequentially turn on the second transfer switch to transfer the electric charges held by the holding unit, transferred a plurality of times, to the amplifying unit for each row, wherein, for the electric charges to be transferred to the amplifying unit, an accumulation time period differs for each row.

Further features of the present invention will become apparent from the following description of exemplary embodiments with reference to the attached drawings.

DESCRIPTION OF THE EMBODIMENTS

Figure 1:
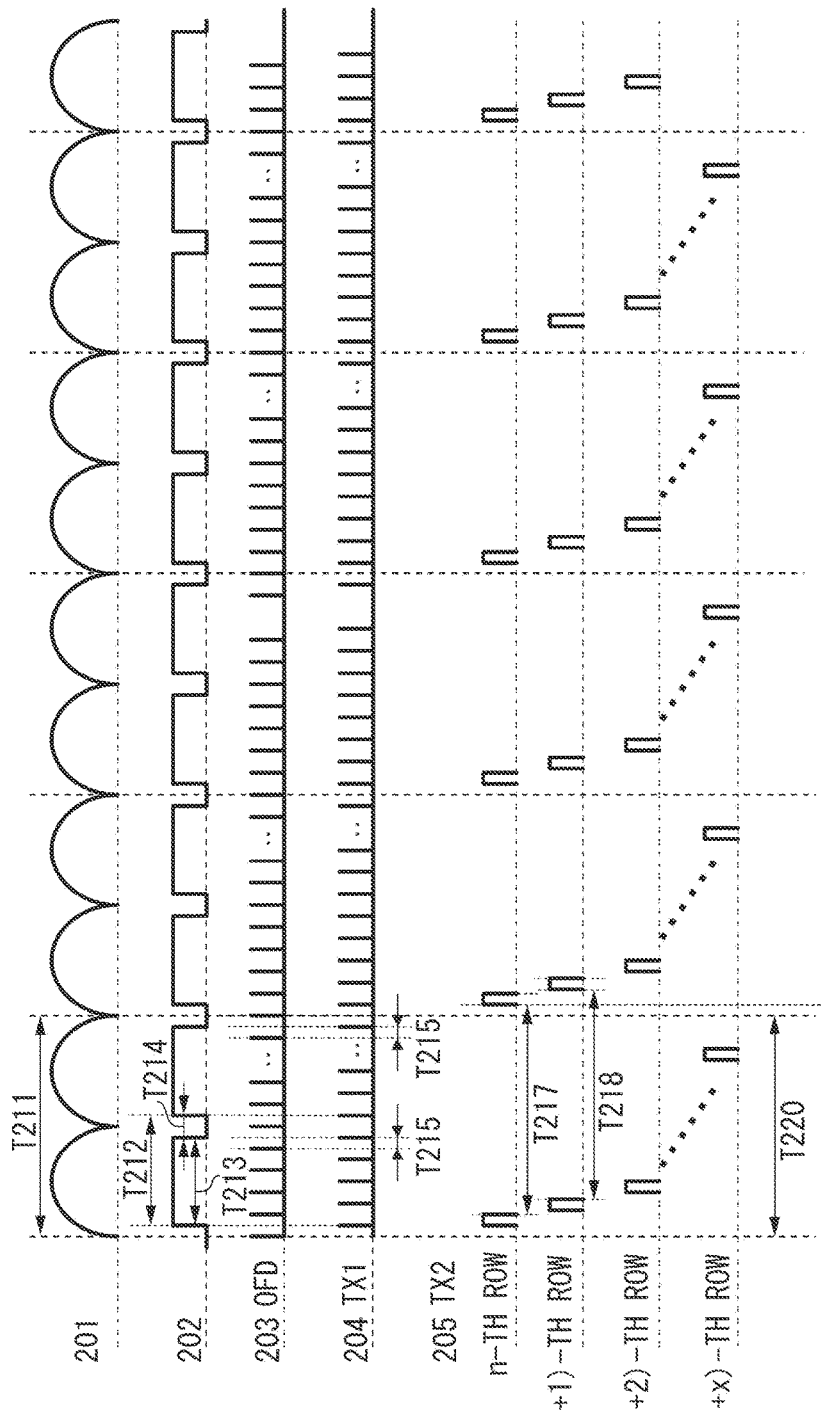
FIG. 1 is a timing chart illustrating driving of an imaging device according to a first exemplary embodiment.

Exemplary embodiments of imaging devices according to the present invention will be described below with reference to the accompanying drawings. In the following descriptions and drawings, identical elements are assigned the same reference numerals and therefore duplicated descriptions will be suitably omitted.

A configuration of an imaging device according to a first exemplary embodiment of the present invention and a method for driving the imaging device will be described below with reference to FIGS. 1 to 4.

<Overall Block Diagram>

Figure 3:
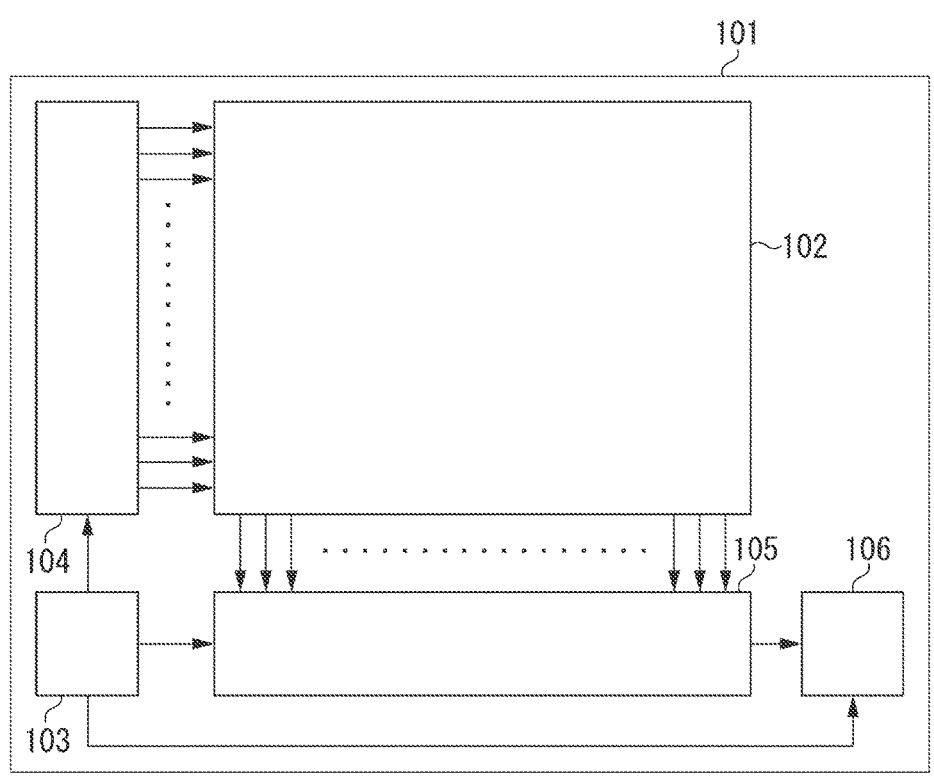
FIG. 3 is a block diagram illustrating an imaging device according to the first exemplary embodiment.

FIG. 3 is an overall block diagram illustrating an imaging device according to the present exemplary embodiment. An imaging device 101 can be configured with one chip using a semiconductor substrate. The imaging device 101 includes a plurality of pixels arranged in an imaging region 102. The imaging device 101 also includes a control unit 103. The control unit 103 supplies control signals and power voltages to a vertical scanning unit 104, a signal processing unit 105, and an output unit 106. The vertical scanning unit 104 supplies drive signals to a plurality of pixels arranged in the imaging region 102. The vertical scanning unit 104 supplies drive signals to each pixel row or each set of a plurality of pixel rows. The vertical scanning unit 104 can be configured with shift registers or address decoders. The signal processing unit 105 includes column circuits, horizontal scanning circuits, and horizontal output lines. Each column circuit may include a plurality of circuit blocks. Circuit blocks include a signal holding unit, a column amplifier circuit, a noise removal unit, and an analog-to-digital (AD) conversion unit. The horizontal scanning circuit can be configured with shift registers or address decoders. An analog signal or a digital signal may be output to the horizontal output lines. The output unit 106 outputs signals transmitted via the horizontal output lines to the outside of the imaging device 101. The output unit 106 includes buffers or amplifier circuits. The vertical scanning unit 104, the signal processing unit 105, and the output unit 106 are arranged outside the imaging region 102.

<Equivalent Circuit of Pixel Unit>

Figure 4:
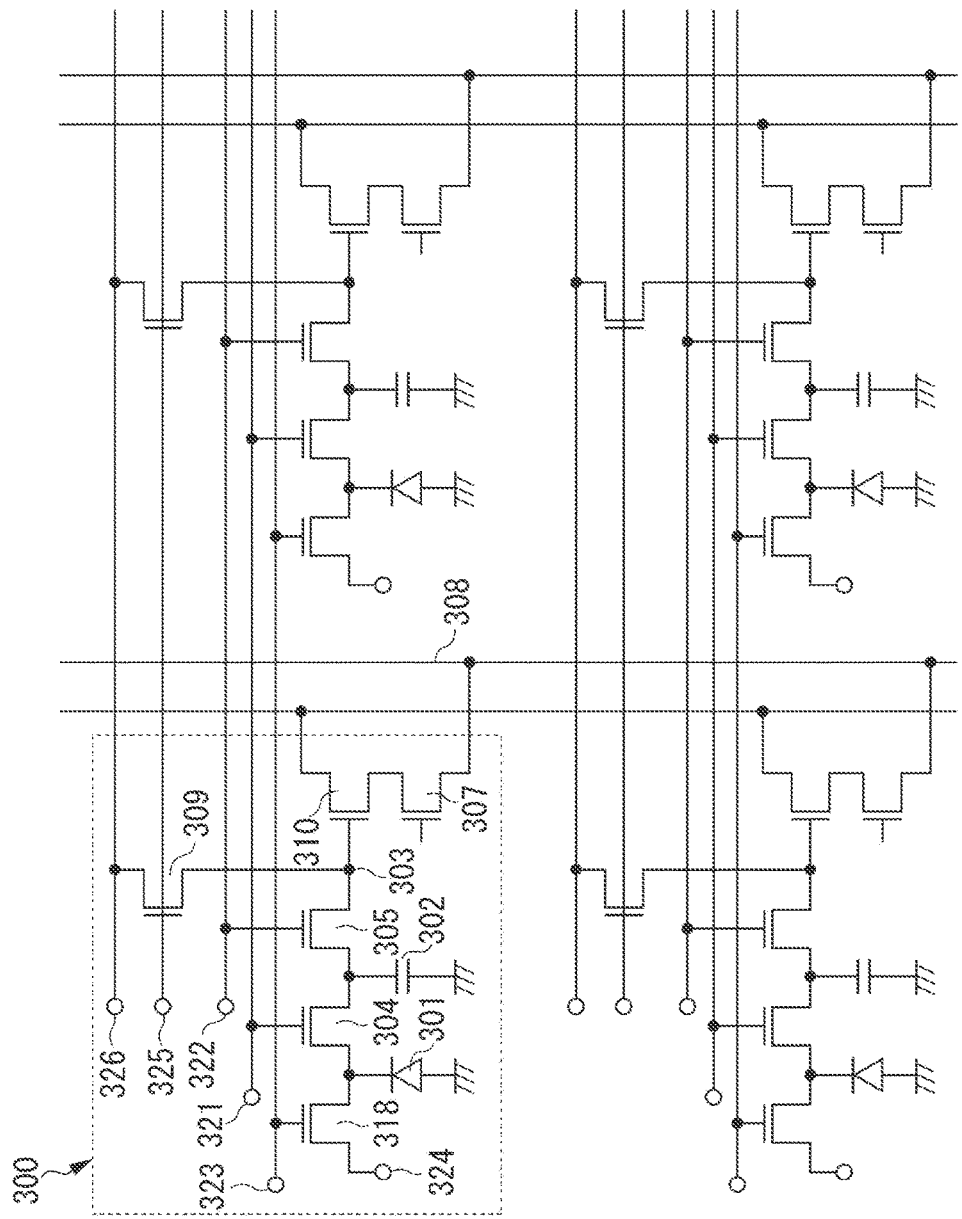
FIG. 4 illustrates equivalent circuits of pixels in the imaging device according to the first exemplary embodiment.

FIG. 4 illustrates an example of a configuration of equivalent circuits of pixel portions in the imaging region 102 according to the present exemplary embodiment. FIG. 4 illustrates four pixels 300 as an example. A pixel 300 includes a photoelectric conversion unit 301, a charge holding unit 302, a first transfer switch 304 (also referred to as "TX1"), and a second transfer switch 305 (also referred to as "TX2"). The pixel 300 also includes an amplifying unit 310, a reset transistor 309, a selection transistor 307, and an input node 303.

The photoelectric conversion unit 301 accumulates the electric charges generated by incident light. A photo-diode, for example, used as the photoelectric conversion unit 301. The first transfer switch 304 transfers the electric charges generated by the photoelectric conversion unit 301 to the charge holding unit 302. The charge holding unit 302 holds the electric charges generated due to the incident light by the photoelectric conversion unit 301. The second transfer switch 305 transfers the electric charges held by the charge holding unit 302 to the input node 303 of the amplifying unit 310. Metal-Oxide Semiconductor (MOS) transistors, for example, are used as the first transfer switch 304 and the second transfer switch 305. The operation of the first transfer switch 304 is controlled by control signals (drive pulses) supplied via a control line 321. The operation of the second transfer switch 305 is controlled by control signals supplied via a control line 322. Although the pixels 300 are arranged in a matrix form, a common control line is connected to the pixels 300 included in the same line.

The selection transistor 307 selects a pixel 300 that outputs a signal to an output line 308. The amplifying unit 310 of the selected pixel 300 outputs a signal based on the electric charges generated by the incident light to the output line 308.

The amplifying unit 310 configures, for example, a source follower circuit. The reset transistor 309 resets the voltage of the input node 303 of the amplifying unit 310 to the potential of a reset line 326 by the signal of a control line 325.

The pixel 300 includes a discharge switch 318 (also referred to as "Overflow Drain (OFD)").

The discharge switch 318 discharges the electric charges of the photoelectric conversion unit 301 to the power supply node 324 such as an overflow drain, and resets the potential caused by the electric charges of the photoelectric conversion unit 301. The operation of the discharge switch 318 is controlled by control signals supplied via a control line 323.

These configurations enable the photoelectric conversion unit 301 to accumulate the generated electric charges while the charge holding unit 302 holds the electric charges. Therefore, in the imaging device 101, the start and the end of the charge accumulation time period can be synchronized between the photoelectric conversion units 301 of a plurality of pixels 300, thus ensuring synchronicity of charge accumulation. The charge accumulation time period can be started, for example, by controlling the discharge switches 318 of a plurality of pixels 300 from ON to OFF.

The discharge switch 318 is not always necessary and a configuration called Vertical Overflow Drain may be employed in which the electric charges from the photoelectric conversion unit 301 are discharged to the semiconductor substrate. A switch (not illustrated) for resetting the potential of the charge holding unit 302 can also be separately provided. After turning the second transfer switch 305 OFF from ON and before transferring the electric charges from the photoelectric conversion unit 301 to the charge holding unit 302, this reset switch may be turned ON to reset the potential of the charge holding unit 302.

<Timing Chart>

FIG. 1 is a timing chart illustrating operations of the imaging device 101 according to the present exemplary embodiment.

A waveform 201 schematically indicates a full-wave rectified waveform of an alternating current (AC) power supply. The AC power supply is a power supply having a frequency of, for example, 50 or 60 Hz. Referring to FIG. 1, a time period T211 is equivalent to the cycle of the AC power supply, for example, 1/50 or 1/60 seconds.

A waveform 202 indicates a lighting state of a light source using the power supply of the waveform 201. The H level indicates a turn-ON state and the L level indicates a turn-OFF state. Examples of light sources operating on an AC power supply include LED light sources used for traffic signals. When the full-wave rectified waveform 201 of the power supply is equal to or higher than a threshold value, the waveform 202 changes to the H level indicating the turn-ON state. On the other hand, when the waveform 201 is below the threshold value, the waveform 202 changes to the L level indicating the turn-OFF state.

A time period T212 indicates a blinking cycle of the light source, which is one half of the time period T211 that is the cycle of the AC power supply. A time period T213 indicates a turn-ON period of the light source, and a time period T214 indicates a turn-OFF period of the light source.

A signal waveform 203 indicates a waveform of the pulse signal of the control line 323 of the discharge switch 318. When this pulse signal is controlled from the L level to the H level, the discharge switch 318 turns ON and the electric charges are discharged from the photoelectric conversion unit 301 to the power supply node 324. According to the present exemplary embodiment, the signal waveform 203 changes from the H level to the L level and the discharge switch 318 changes from ON to OFF at the same timing for all pixels. Therefore, charge accumulation in the photoelectric conversion unit 301 is started at the same timing for all pixels. According to the present specification, "the same timing" does not necessarily mean exact synchronicity but means substantially the same time.

A signal waveform 204 indicates a waveform of the pulse signal of the control line 321 of the first transfer switch 304. When this pulse signal changes from the L level to the H level, the first transfer switch 304 changes from OFF to ON and the electric charges generated by the photoelectric conversion unit 301 are transferred to the charge holding unit 302. According to the present exemplary embodiment, the signal waveform 204 changes from the L level to the H level for all pixels. Therefore, the electric charges generated by the photoelectric conversion unit 301 are simultaneously transferred to the charge holding unit 302 for all pixels, and the first charge accumulation is ended at the same timing for all pixels.

A time period T215 indicates a time period (sampling period) from the start to the end of one charge accumulation. The present exemplary embodiment is characterized in short-time sampling performed a plurality of times. More specifically, for all pixels, when the first transfer switch 304 intermittently turns ON a plurality of times at the same timing, the electric charges are intermittently transferred from the photoelectric conversion unit 301 to the charge holding unit 302 a plurality of times. The operation of intermittently turning the discharge switch 318 ON and OFF is repeated so that the discharge switch 318 turns OFF for all pixels at the time when the first transfer switch 304 turns ON.

A signal waveform 205 indicates a waveform of the pulse signal of the control line 322 of the second transfer switch 305. When this pulse signal changes from the L level to the H level, the second transfer switch 305 turns ON and the electric charges held by the charge holding unit 302 are transferred to the amplifying unit 310. FIG. 1 illustrates the signal waveforms 205 for controlling the second transfer switches 305 provided in the n-th to (n+x)-th rows. As illustrated in FIG. 1, the pulse signal of the control line 322 of the second transfer switch 305 row-sequentially changes from the L level to the H level, and therefore the second transfer switch 305 also row-sequentially turns ON. Accordingly, the electric charges held on a row basis by the charge holding unit 302 are transferred to the amplifying unit 310.

A time period T217 is a time period during which the electric charges are held by the charge holding unit 302 in the n-th row. In the time period T217, in the n-th row, the first transfer switch 304 intermittently turns ON a plurality of times while the second transfer switch 305 is maintained to OFF. As a result, the electric charges are transferred to the charge holding unit 302. Therefore, the time period T217 is also a time period during which the photoelectric conversion unit 301 generates the electric charges to be held by the charge holding unit 302. The time period T217 is equivalent to a time period since the start of the first sampling operation until the end of the last sampling operation in sampling operations performed a plurality of times. According to the present exemplary embodiment, signals generated with multi-exposure are accumulated by the charge holding unit 302 because of such control. Similarly, the time period T218 indicates a time period since the start of the first sampling operation till the end of the last sampling operation in the (n+1)-th row.

According to the present exemplary embodiment, since the first transfer switch 304 is controlled at the same timing for all pixels, the first transfer switches 304 of the pixel (first pixel) in the n-th row and the pixel (second pixel) in the (n+1)-th row are controlled at the same timing. On the other hand, the second transfer switch 305 of the pixel (second pixel) in the (n+1)-th row is controlled to ON in a state where the second transfer switch 305 of the pixel (first pixel) in the n-th row is maintained to OFF. Thus, charge transfer from the charge holding unit 302 the amplifying unit 310 is row-sequentially performed.

A time period T220 indicates one-frame period. During this period, an image for one frame is row-sequentially output from the charge holding unit 302 to the amplifying unit 310.

Figure 2:
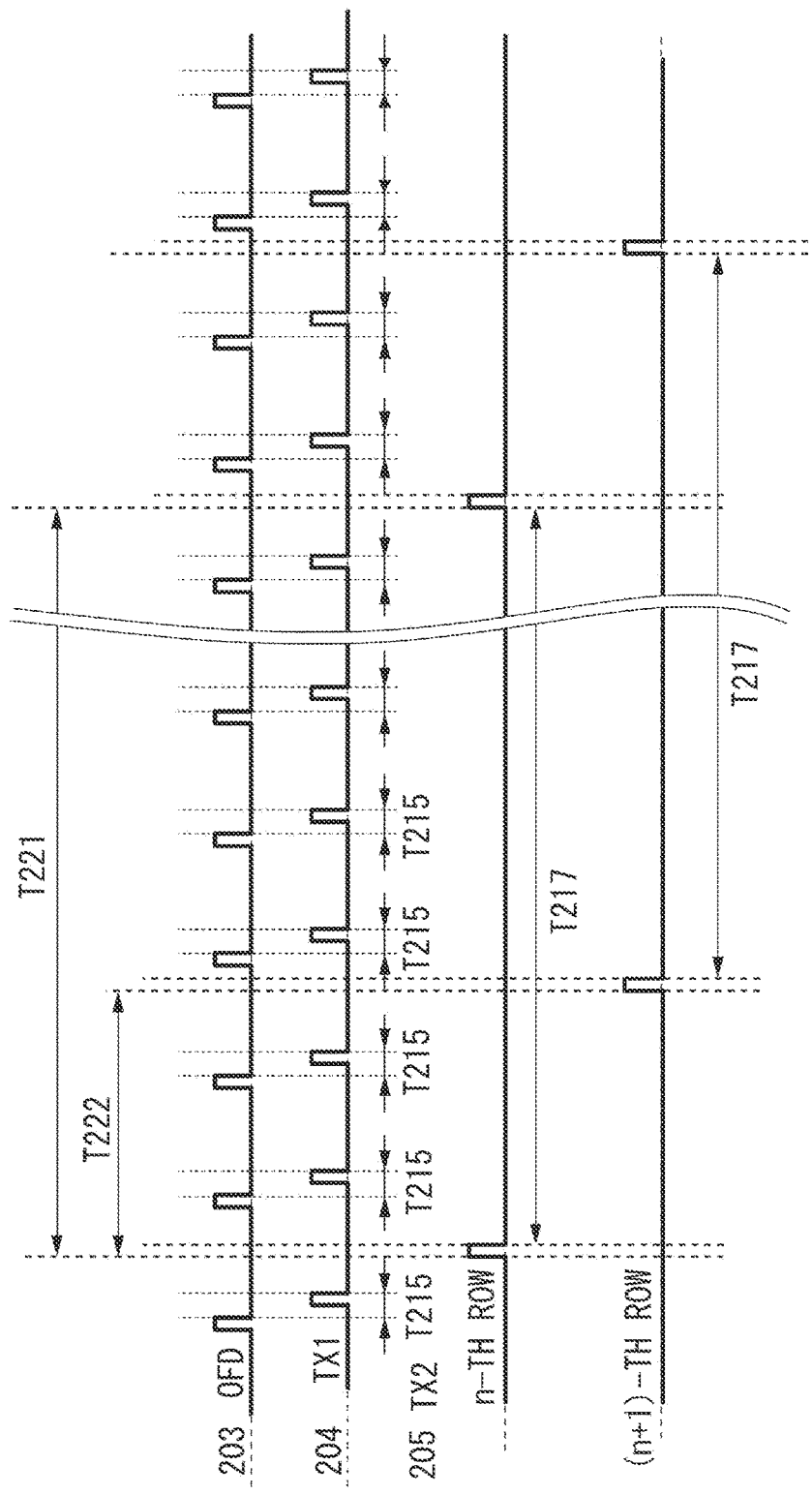
FIG. 2 is a timing chart illustrating driving of the imaging device according to the first exemplary embodiment.

FIG. 2 illustrates in detail a relationship between the signal waveforms 203, 204, and 205 out of the signals illustrated in FIG. 1. These waveforms correspond to the discharge switch 318, the first transfer switch 304, and the second transfer switch 305, respectively.

The time period T215 indicates one sampling period. This time period is equivalent to a time period since the time when the discharge switch 318 changes from ON to OFF till the time when the first transfer switch 304 changes from ON to OFF. At the time when the first transfer switch 304 turns ON a plurality of times, the discharge switch 318 is OFF.

A time period T221 indicates one-frame period and is equivalent to a time period since the time when the second transfer switch 305 in the n-th row changes from OFF to ON till the time when the second transfer switch 305 in the n-th row changes from OFF to ON again.

A time period T222 indicates a vertical scanning interval for each row and, for example, is equivalent to a time period since the time when the second transfer switch 305 of the pixel in the n-th row changes from OFF to ON till the time when the second transfer switch 305 of the pixel in the (n+1)-th row changes from OFF to ON.

The time period T215 may be, for example, a time period equal to or shorter than a half of the time period T212 (blinking cycle of the light source). Setting the time periods in this way increases the possibility that, even when any one of a plurality of sampling operations is performed in the turn-OFF state, another sampling in the same frame is performed in the turn-ON state.

According to the present exemplary embodiment, sampling with the short exposure time is repeated a plurality of times and the electric charges are added by the charge holding unit 302, it is possible to average signal charges in the turn-ON and the turn-OFF states of the light source, thus suppressing incorrect detections. Further, sampling a larger number of times than sampling at intervals of a half of the blinking cycle of the light source enables improving the detection accuracy of the subject and restraining image degradation under a blinking light source. For example, the time period T215 may be set to a ¼ or less or ⅛ or less of the time period T212.

The time period T217 needs only to be longer than the time period T212 (blinking cycle of the light source). However, to improve the detection accuracy of the subject and restrain image degradation under a blinking light source, the time period T217 needs to be prolonged. For example, the length of the timer period T217 may be set to an integral multiple of the blinking cycle of the light source. Particularly in a case of a commercial power supply of which the frequency and cycle are clear, it is desirable to set length the time period T217 to an integral multiple of the blinking cycle of the light source in this way.

According to the present exemplary embodiment, the timing of starting and the timing of ending each sampling operation are synchronized between all pixels. This enables ensuring synchronicity of charge accumulation in each row.

The imaging device 101 intermittently performs sampling with a shorter charge accumulation time period a plurality of times and adds and multiplexes the sampled electric charges by the charge holding unit 302 to acquire the amount of charges for one frame. Even when the light source is blinking, performing the above-described driving method enables averaging the influence of variations of the light source and providing effects of restraining the influence of flickers because of multi-exposure with dispersed sampling operations.

On the other hand, since the second transfer switch 305 is row-sequentially driven, the timing when the second transfer switch 305 changes from OFF to ON differs for each row. More specifically, the multiplexing period since the start of the first sampling operation for sampling the electric charges to be held by the charge holding unit 302 until the end of the last sampling operation is differentiated on a row basis. Therefore, depending on a row, the electric charges to be multiplexed are separated in the preceding and following frames. However, since information itself exists in either of the preceding and following frames, missing of information can be restrained by acquiring information from the preceding and following frames at the time of image recognition.

According to the present exemplary embodiment, the discharge switch 318 and the first transfer switch 304 are collectively controlled for all pixels. On the other hand, the second transfer switch 305 is row-sequentially controlled. Therefore, the control unit 103 illustrated in FIG. 3 can be provided with two different pulse generation units. A first pulse generation unit generates drive pulses for the discharge switch 318 and the first transfer switch 304. On the other hand, a second pulse generation unit generates a drive pulse for the second transfer switch 305. More specifically, the first pulse generation unit determines the sampling cycle, the sampling length, and the sampling time period. On the other hand, the second pulse generation unit determines the length of the time period during which sampled electric charges are multiplexed and the ratio of the charge accumulation time period occupying one frame in a certain row. Providing two different pulse generation units in this way enables setting independent combinations of both units. This makes it possible to control the amount of exposure after multiplexing, the ratio of dispersion of sampling operations over time for multiplexed images, and the ratio of images to be multiplexed. Thus, it becomes possible to flexibly set image capturing conditions for a multi-exposure image.

Instead of independently combining two pulse generation units, it is useful to synchronize the pulse from the first pulse generation unit and the pulse from the second pulse generation unit with each other. For example, when the second transfer switch 305 of a certain row turns ON in a state where the first transfer switches 304 of all rows are ON, the electric charges transferred from the photoelectric conversion unit 301 are not accumulated in the charge holding unit 302 but transferred to the amplifying unit 310. To restrain such an operation, the pulses from the two pulse generation units are synchronized with each other. More specifically, a pulse obtained by multiplying the horizontal scanning frequency (frequency corresponding to the timing when the second transfer switch 305 row-sequentially turns ON) based on the pulse from the second pulse generation unit may be used as a pulse from the first pulse generation unit. Alternatively, a pulse obtained by dividing the horizontal scanning frequency may be used as a pulse from the first pulse generation unit.

A normal global electronic shutter outputs the electric charges from the charge holding unit 302 to the amplifying unit 310 after completion of the charge accumulation time period for all rows, a time period during which charge accumulation is not performed may arise between frames. This may cause a sense of strangeness, which may occur, for example, when the propeller of a propeller airplane appears to be irregularly rotating although it is rotating at a constant rotational speed. In the driving operation according to the present exemplary embodiment, since sampling exposure is constantly performed at fixed intervals over a plurality of frames, an image can be captured without a sense of strangeness even in a case of moving image capturing.

In the above descriptions, the start and the end of each sampling operation are synchronized between all pixels. However, it is not always necessary that sampling is simultaneously started for all pixels. The start and the end of the sampling operation only need to be synchronized between a plurality of pixels suitably selected depending on use.

A configuration of the imaging device 101 for expanding the dynamic range, a method for driving the imaging device 101, and an imaging system having the imaging device 101 according to a second exemplary embodiment will be described below with reference to FIGS. 5 and 6.

According to the present exemplary embodiment, an image with a short exposure time and an image with a long exposure time can be acquired while restraining the influence due to the blinking state of the light source, making it possible to acquire an image of a high-quality dynamic range with restrained flickers. Images can be acquired while ensuring synchronicity. Therefore, when combining images with an expanded dynamic range, no distortion arises between an image with the short exposure time and an image with the long exposure time, achieving high-quality image combination.

Figure 5:
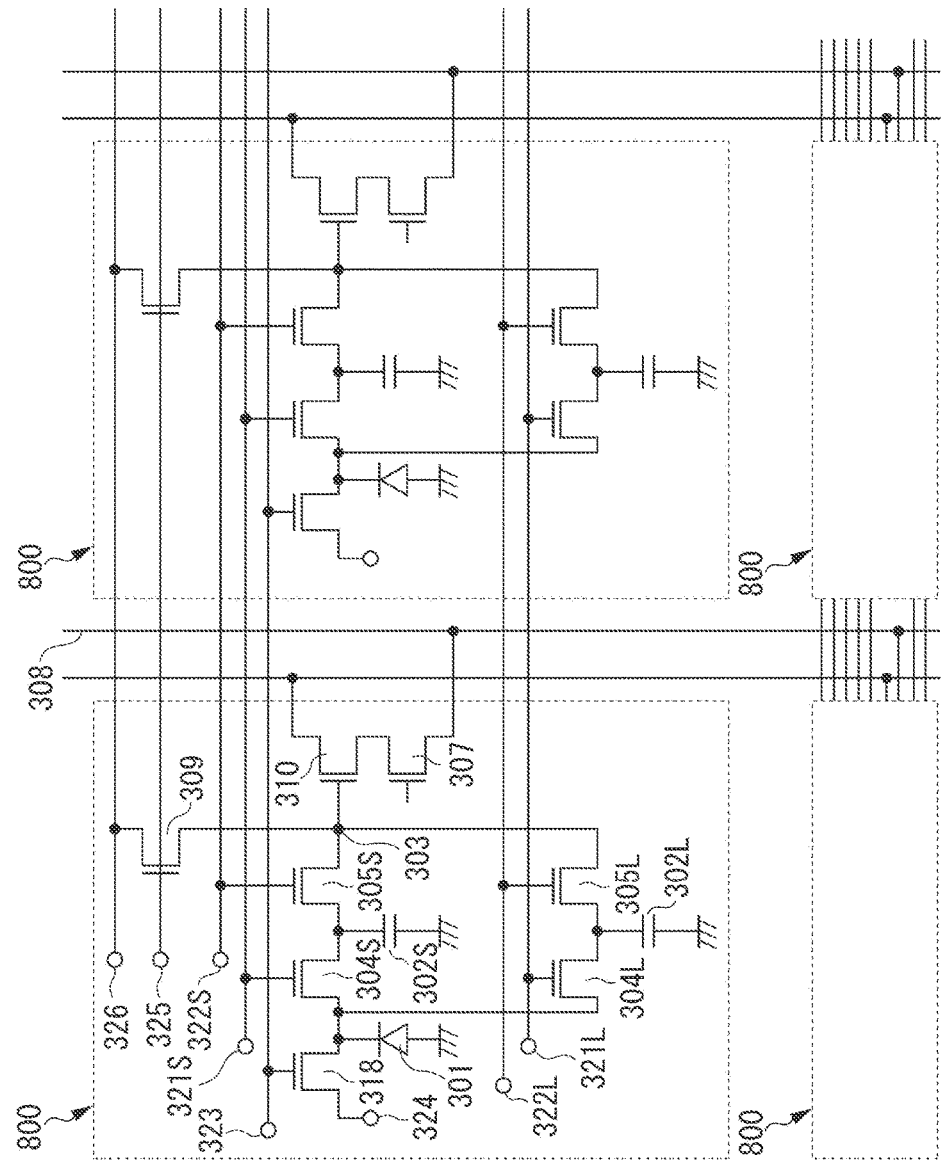
FIG. 5 illustrates equivalent circuits of pixels in an imaging device according to a second exemplary embodiment.

FIG. 5 illustrates an example of a configuration of equivalent circuits of pixel portions of the imaging region 102 according to the present exemplary embodiment. In comparison with the pixel 300 illustrated in FIG. 4, a pixel 800 has two different combinations of the first transfer switch 304, the charge holding unit 302, and the second transfer switch 305. In the present exemplary embodiment, when each component included in each set needs to be distinguished, subscripts S and L are added to the reference numeral of each component (for example, a charge holding unit 302S).

As illustrated in FIG. 5, according to the present exemplary embodiment, control lines 321S and 321L for controlling the first transfer switches 304S and 304L are respectively provided. The first transfer switch 304L may be denoted as a third transfer switch 304L to be distinguished from the first transfer switch 304S. Control lines 322S and 322L for controlling the second transfer switches 305S and 305L are respectively provided. The second transfer switch 305L may be denoted as a fourth transfer switch 305L to be distinguished from the second transfer switch 305S. Other components are similar to those in the pixel 300 according to the first exemplary embodiment.

With this configuration, the electric charges can be transferred to the second charge holding unit 302L even in a state where the electric charges are held by the first charge holding unit 302S. The electric charges can also be transferred to the first and second charge holding unit 302S or 302L even in a state where the electric charges are held by the first and second charge holding units 302S and 302L. Therefore, signals with high synchronicity can be held in both charge holding units.

In the pixel 800, the electric charges generated by the photoelectric conversion unit 301 are held by the charge holding units 302S and 302L according to the time selected for the first transfer switches 304S and 304L, respectively. According to the first exemplary embodiment, the imaging device 101 performs the sampling operation with the same exposure time for each frame to generate an image with the same exposure time for each frame. On the other hand, the present exemplary embodiment is characterized in that the pixel 800 uses the first and second charge holding units 302S and 302L to parallelly perform sampling with different exposure times.

<Timing Chart>

Figure 6:
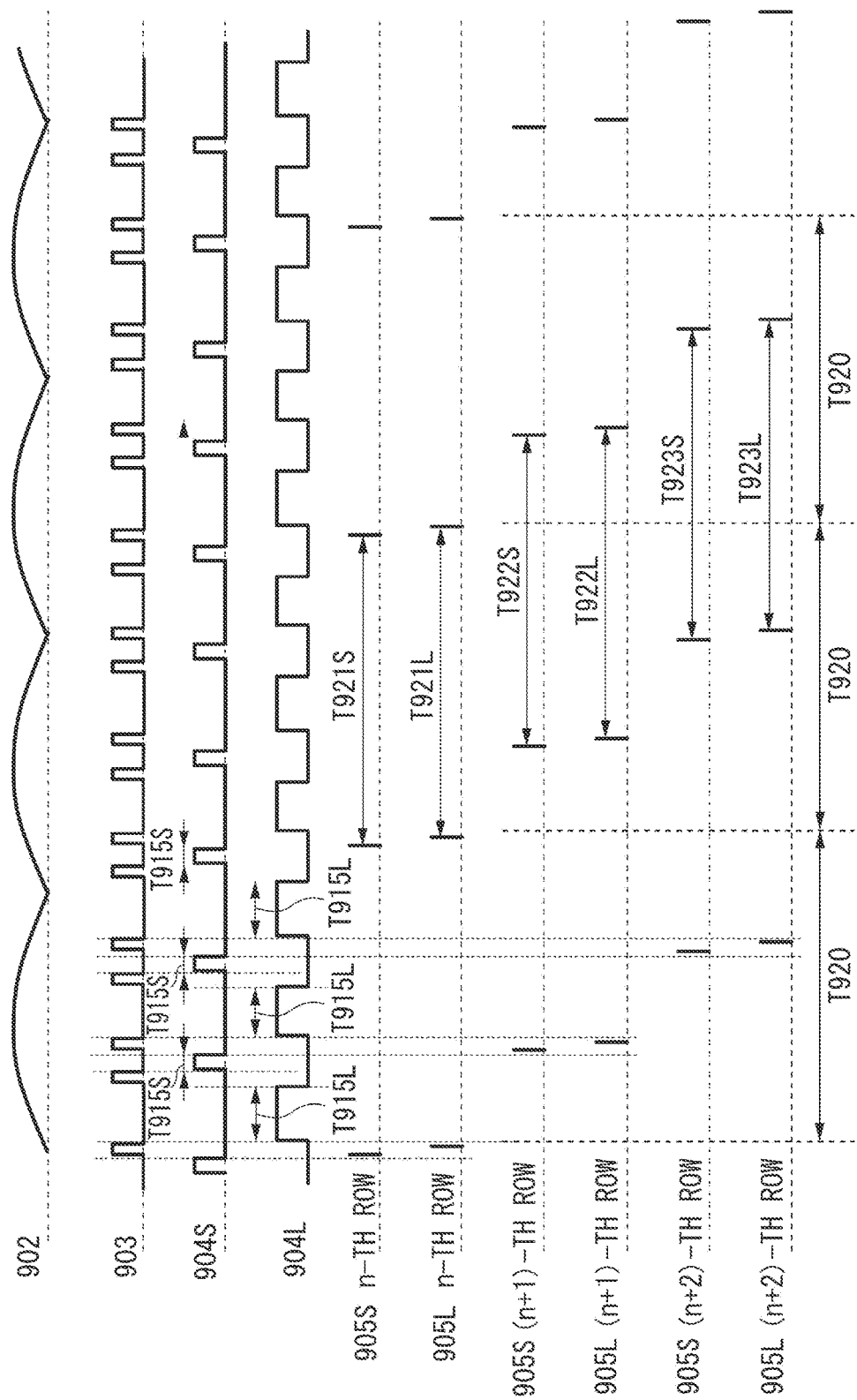
FIG. 6 is a timing chart illustrating driving of the imaging device according to the second exemplary embodiment.

FIG. 6 is a timing chart illustrating operations of the imaging device 101 according to the present exemplary embodiment. A waveform 902 indicates a lighting waveform of an analog-modulated LED light source used for display of electric bulletin boards, various lighting devices used in cars.

A waveform 903 indicates a waveform of the pulse signal of the control line 323 of the discharge switch 318. When this pulse signal is controlled from the L level to the H level, the discharge switch 318 turns ON and the electric charges are discharged from the photoelectric conversion unit 301 to the power supply node 324. In the present exemplary embodiment, all pixels are controlled to be from the L level to the H level and vice versa at the same timing.

A signal waveform 904S is the waveform of the pulse signal of the control line 321S of the first transfer switch 304S. A signal waveform 904L is the waveform of the pulse signal of the control line 321L of the first transfer switch 304L. According to the present exemplary embodiment, the electric charges generated by the photoelectric conversion unit 301 are transferred to the charge holding unit 302S or 302L at the same time for all pixels.

When the signal waveform 904S changes from the L level to the H level, the electric charges generated by the photoelectric conversion unit 301 are transferred to the charge holding unit 302S. According to the present exemplary embodiment, the first transfer switches 304S of all pixels are controlled to be from ON to OFF at the same timing. Similarly, for all pixels, when the signal waveform 904L changes from the L level to the H level at the same timing, the first transfer switches 304L of all pixels change from ON to OFF, and the electric charges generated by the photoelectric conversion unit 301 are transferred to the charge holding unit 302L.

With this configuration, the electric charges generated by the photoelectric conversion unit 301 in the time period specified by the signal waveforms 903 and 904S can be held in the charge holding unit 302S. Similarly, the electric charges generated by the photoelectric conversion unit 301 in the time period specified by the signal waveforms 903 and 904L can be held in the charge holding unit 302L. More specifically, this configuration enables sampling with different lengths of the charge accumulation time period for the charge holding units 302S and 302L while ensuring synchronicity. This enables suppressing the occurrence of image shifts generated relative to the movement of the subject and the camera. To expand the dynamic range, it is necessary that the amount of the charges held by the charge holding unit 302S is different from the amount of the charges held by the charge holding unit 302L. Therefore, the number of times of charge transfer to the charge holding unit 302S may be differentiated from that of charge transfer to the charge holding unit 302L on the premise of the same length of each sampling (the length of each time period during which the first or the third transfer switch is intermittently turned ON).

A time period T915S is a time period during which the electric charges to be held by be charge holding unit 302S are accumulated, and is equivalent to a short-time sampling period. On the other hand, a time period T915L is a time period during which the electric charges to be held by the charge holding unit 302L are accumulated, and is equivalent to a long-time sampling period. More specifically, the length of the time period (time period T915S) since the time when the first transfer switch 304S is turned ON till the time when it is turned OFF is shorter than the length of the time period (second time period T915L) since the time when the third transfer switch 304L is turned ON till the time when it is turned OFF.

Referring to FIG. 6, the time periods T915s and T915L do not temporally overlap with each other or are different timing from each other. Alternately performing a short-time sampling operation and a long-time sampling operation enables generating a plurality of images with different exposure times in the same frame. The time periods T915S and T915L may be temporally partly overlapped with each other. In this case, charge accumulation is performed in both the charge holding units 302S and 302L at the same timing. This configuration may be permitted since the length of the charge accumulation time period needs to be different between the charge holding units 302S and 302L as a result.

The signal waveform 905S is the waveform of the pulse signal of the control line 322S of the second transfer switch 305S. The signal waveform 905L is the waveform of the pulse signal of the control line 322L of the second transfer switch 305L. When the signal waveform 905S changes from the L level to the H level, the second transfer switch 305S turns ON, and the electric charges held by the charge holding unit 302S are row-sequentially transferred to the output unit 112. Similarly, when the signal waveform 905L changes from the L level to the H level, the second transfer switch 305L turns ON, and the electric charges held by the charge holding unit 302L are row-sequentially transferred to the output unit 112.

A time period T920 indicates one-frame period and is a transfer period for one screen. In the time period T920, an image for one frame from the first to the last row is row-sequentially output to the output unit 112.

Time periods T921S and T921L indicate time periods during which the electric charges sampled a plurality of times are held by the charge holding units 302S and 302L, respectively, in the n-th row. Similarly, time periods T922S and T922L indicate time periods during which the electric charges are held by the charge holding units 302S and 302L, respectively, in the (n+1)-th row, and time periods T923S and T923L indicate time periods during which the electric charges are held by the charge holding units 302S and 302L, respectively, in the (n+2)-th row.

According to the present exemplary embodiment, during the time period T920 (i.e., a time period for one frame), the imaging device 101 performs the short-time sampling operation indicated by the time period T915S three times to generate a multi-exposure image. Further, during the time period T920, the imaging device 101 performs the long-time sampling operation indicated by the time period T915L three times to generate a multi-exposure image.

According to the present exemplary embodiment, providing two different charge holding units (the charge holding units 302S and 302L) and inputting suitable pulses to respective control lines enable generating two images with different exposure times.

Two multi-exposure images with different exposure times are images obtained by performing sampling a plurality of times at certain time intervals. Therefore, the resultant information is not information of an instant during which the lighting state of the light source varies but information of multiplexed sampling exposures performed a plurality of times. Therefore, it is possible to restrain flickers or flicker-like fluctuations occurring when the light source is captured.

Further, since each of the multi-exposure images is obtained by performing sampling of the same frame period a plurality of times, the obtained images are images captured with two different exposure times at almost the same time. Therefore, combining these read multi-exposure images enables obtaining an image with an expanded dynamic range. The details thereof will be described below.

Also in the present exemplary embodiment, as described in the first exemplary embodiment, it is possible to flexibly set image capturing conditions for a multi-exposure image by providing the first and the second pulse generation units. The pulse from the first pulse generation unit may be a pulse synchronized with horizontal scanning, obtained by multiplying the horizontal scanning frequency, or a pulse synchronized with horizontal scanning, obtained by dividing the horizontal scanning frequency.

Further, in the present exemplary embodiment, the imaging device 101 performs the short-time sampling operation three times and performs the long-time sampling operation three times. However, the number of sampling operations is not limited thereto. The sampling operation may be performed twice or any larger number of times. Further, in one-frame period, the number of times of the short-time sampling operation performed may be different from that of the long-time sampling operation.

Decreasing the pulse intervals of the signal waveforms 904S and 904L to increase the number of times of sampling operations improves effects of restraining flickers. When the blinking frequency of the light source is N (Hz), effects of restraining flickers appear when the sampling cycle (Hz) exceeds N (Hz). Sufficient effects appear when the sampling cycle (Hz) exceeds 2N (Hz). For example, under illumination of a fluorescent light using a 50-Hz commercial power supply, flickers tend to appear when capturing an image at 100 Hz. In this case, effects of restraining flickers appear when the sampling cycle (Hz) exceeds 100 Hz, and sufficient effects may be obtained when the sampling cycle (Hz) exceeds 200 Hz. In the case of a light source operating on a 50-Hz commercial power supply, effects of restraining flickers are acquired when the pulse interval of the signal waveforms 904S and 904L is set to 10 milliseconds or shorter. Further, to improve effects of restraining flickers, the pulse interval of the signal waveforms 904S and 904L may be shorter than, for example, 5 milliseconds.

To increase effects of restraining flickers, the sum of the exposure times for charge multiplexing may be prolonged. For example, the total time obtained by adding the sum of the exposure times of the short-time sampling operation and the sum of the exposure times of the long-time sampling operation may be equal to or larger than a half of the blinking cycle of the light source.

Although each pixel 800 is provided with two sets of the charge holding unit 302, the first transfer switch 304, and the second transfer switch 305, it may be provided with, for example, at least three sets to generate at least three images with different exposure times for each frame.

In addition, referring to FIG. 6, although the imaging device 101 parallelly performs the short-time and the long-time sampling operations, the short-time and the long-time sampling operations may be performed separately. For example, in a time period during which the first transfer switch 304S is intermittently repeating turning ON a plurality of times to perform the short-time sampling operation, the first transfer switch 304L is maintained to OFF. On the other hand, in a time period during which the first transfer switch 304L is intermittently repeating turning ON a plurality of times to perform the long-time sampling operation, the first transfer switch 304S is maintained to OFF. This operation enables separating the short-time and the long-time sampling operations in one frame. In addition, the imaging device 101 is able to not only perform the short-time and the long-time sampling operations in a completely parallel way or in a separate way but also suitably select an intermediate way.

<Example of Configuration of Imaging System>

An imaging system capable of expanding the dynamic range using the imaging device 101 according to a second exemplary embodiment will be described below with reference to FIGS. 7, 8A, and 8B.

Figure 7:
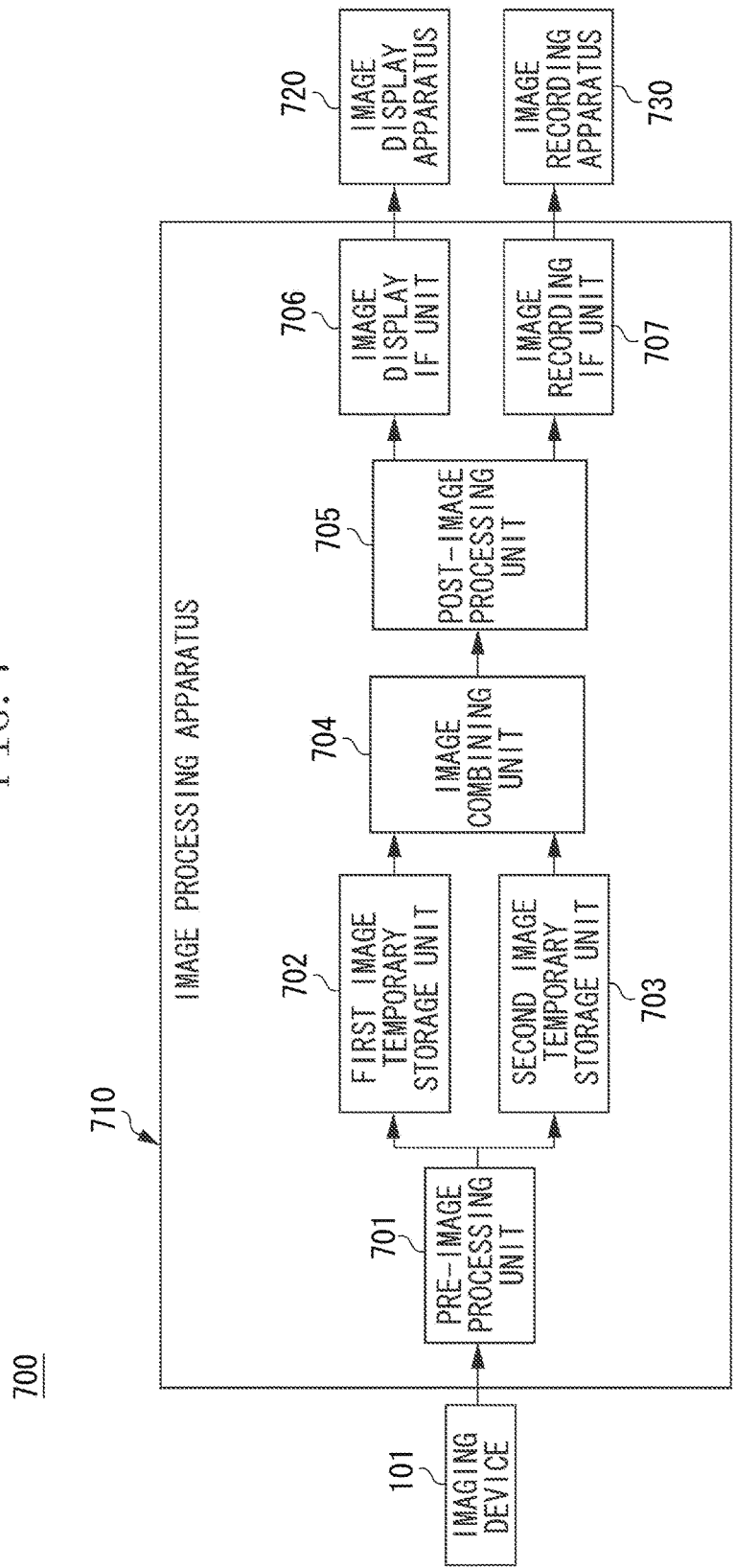
FIG. 7 is a block diagram illustrating an imaging system according to the second exemplary embodiment.

FIG. 7 illustrates an example of a configuration of an image processing apparatus 710 in an imaging system 700 according to the present exemplary embodiment. The image processing apparatus 710 receives an image signal for each frame from the imaging device 101, combines at least two images with different exposure times, and outputs a display signal to an image display apparatus 720 and a recording signal to the image recording apparatus 730. A pre-image processing unit 701 performs image processing such as black level correction processing on image data input from the imaging device 101.

A first image temporary storage unit 702 temporarily stores obtained short-time exposure image data in a frame memory in one frame. A second image temporary storage unit 703 temporarily stores long-time exposure image data in a frame memory in one frame. An image combining unit 704 combines the short-time exposure image input from the first image temporary storage unit 702 with the long-time exposure image input from the second image temporary storage unit 703 to generate a combined image with an expanded dynamic range. A post-image processing unit 705 converts a pixel array signal of an image sensor of, for example, a Bayer array, into a video signal such as the general red, green, and blue (RGB) signal and YCbCr signal. The post-image processing unit 705 may perform image quality correction such as a white balance and gamma correction on the combined image. An image display interface (IF) unit 706 is an interface unit for transmitting an image display signal and control signals to the image display apparatus 720 and receiving control signals therefrom. An image recording IF unit 707 is an interface unit for transmitting an image recording signal and control signals to the image recording apparatus 730 and receiving control signals.

Figure 8A:
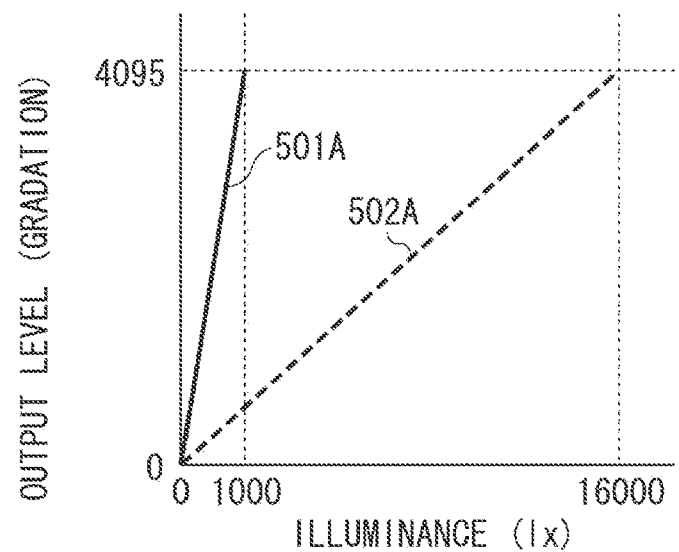
FIGS. 8A and 8B illustrate the imaging system according to the second exemplary embodiment.
Figure 8B:
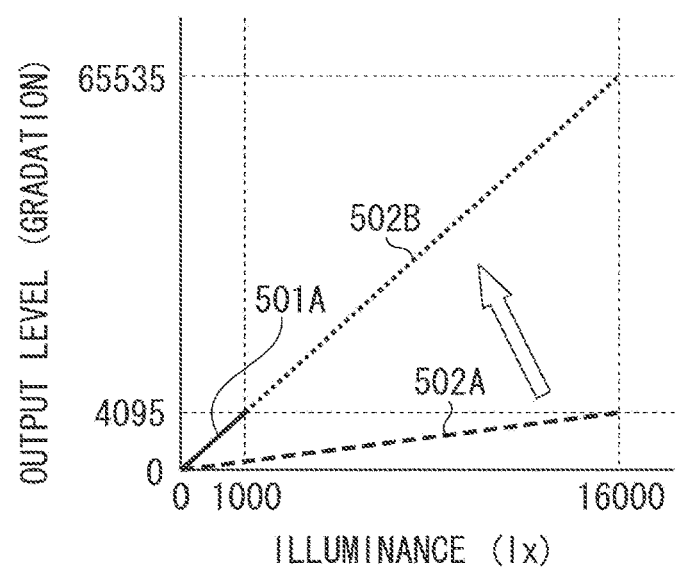

FIGS. 8A and 8B illustrate a method for generating an image with an expanded dynamic range by the image combining unit 704 of the imaging system 700 according to the present exemplary embodiment. In the present exemplary embodiment, a case is described where the image combining unit 704 combines the short-time exposure image and the long-time exposure image and increases the gradation number of the output level from 4096 to 65536 or equivalent, to expand the dynamic range from 72 dB or equivalent to 96 dB or equivalent.

FIG. 8A illustrates a relationship between the illuminance and the output level before performing image combination. A characteristic 501A is mainly used to capture a dark region of the subject and indicates output level characteristics for the illuminance at the time of long-time exposure image capturing. The image sensor is assumed to output a 12-bit signal and therefore output the gradation number 4096. A characteristic 502A is mainly used to capture a bright region of the subject and indicates output level characteristics for the illuminance at the time of short-time exposure image capturing. The inclination of the characteristics of the short-time exposure image with the short exposure time is more moderate than the inclination of the characteristics of the long-time exposure image. For example, the exposure time of the long-time exposure image is assumed to be 16 times the sum of the exposure times of the short-time exposure images.

According to the present exemplary embodiment, the output level at the time of long-time exposure image capturing is set to reach 4095 gradations with an illuminance of 1000lx, and the output level at the time of short-time exposure image capturing is set to reach 4095 gradations with an illuminance of 16000lx which is 16 times 1000lx. To combine an image captured with long-time exposure and an image captured with short-time exposure, the imaging device 101 generates an image by digitally shifting image data captured by short-time exposure to the higher side by 4 bits. This causes the image data captured by short-time exposure to shift to the higher side by 4 bits to generate 16-bit data with the gradation number 65536. Subsequently, the imaging device 101 combines the long-time exposure image and the short-time exposure image. The imaging device 101 generates a 16-bit image by using the image data captured by long-time exposure in a case of the output level (gradation number) equal to or lower than a certain threshold output level, or by using the image data captured by short-time exposure in a case of the output level (gradation number) higher than the threshold output level. For example, the threshold output level (gradation number) is 4095.

FIG. 8B illustrates an output level (gradation number) of the image after combination with respect to the illuminance. A characteristic 501A with long-time exposure is a region in which data of the threshold output level (gradation number 4095) or lower is used as it is. A characteristic 502B is a characteristic generated by shifting the characteristic 502A of data of the short-time exposure image to the higher side by 4 bits. The characteristic 502B is a region of the output level higher than the threshold output level (gradation number 4095). The image after combination has a 16-bit gradation accuracy in the dark portion and an expanded dynamic range with which the saturation level is increased 16 times for image capturing in the dark portion. In the present exemplary embodiment, the exposure time with long-time exposure is 16 times the exposure time with short-time exposure. For example, setting a larger ratio of exposure time enables obtaining an image having a dynamic range of 100 dB or higher.

When capturing an image of the lighting condition of a bright signal outside a dark tunnel by using an on-vehicle camera mounted on a car running in the tunnel, the use of the above-described configuration and driving method reduces the possibility that the lighting condition of the bright signal subjected to short-time exposure is incorrectly detected. An imaging device 101 combines the short-time and long-time exposure images to enable obtaining a clear image having a wide dynamic range covering from the dark portion in the tunnel to the bright portion outside the tunnel.

The above-described imaging device according to the second exemplary embodiment is provided with two different charge holding units in one pixel to respectively hold the accumulated electric charges with the short exposure time and the accumulated electric charges with the long exposure time in the separate charge holding units to acquire information, thus expanding the dynamic range. On the other hand, an imaging device according to the present exemplary embodiment provides two different time periods in one frame: a time period (first holding period) during which the accumulated electric charges with the short exposure time are held and a time period (second holding period) during which the accumulated electric charges with the long exposure time are held, thus expanding the dynamic range. The present exemplary embodiment has an advantage of eliminating the need of providing two charge holding units in one pixel.

The configuration of the imaging device 101 according to the present exemplary embodiment is similar to that illustrated in FIG. 3. Further, the configuration of the equivalent circuit of a pixel portion of the imaging device 101 according to the present exemplary embodiment is similar to that illustrated in FIG. 4.

Figure 9:
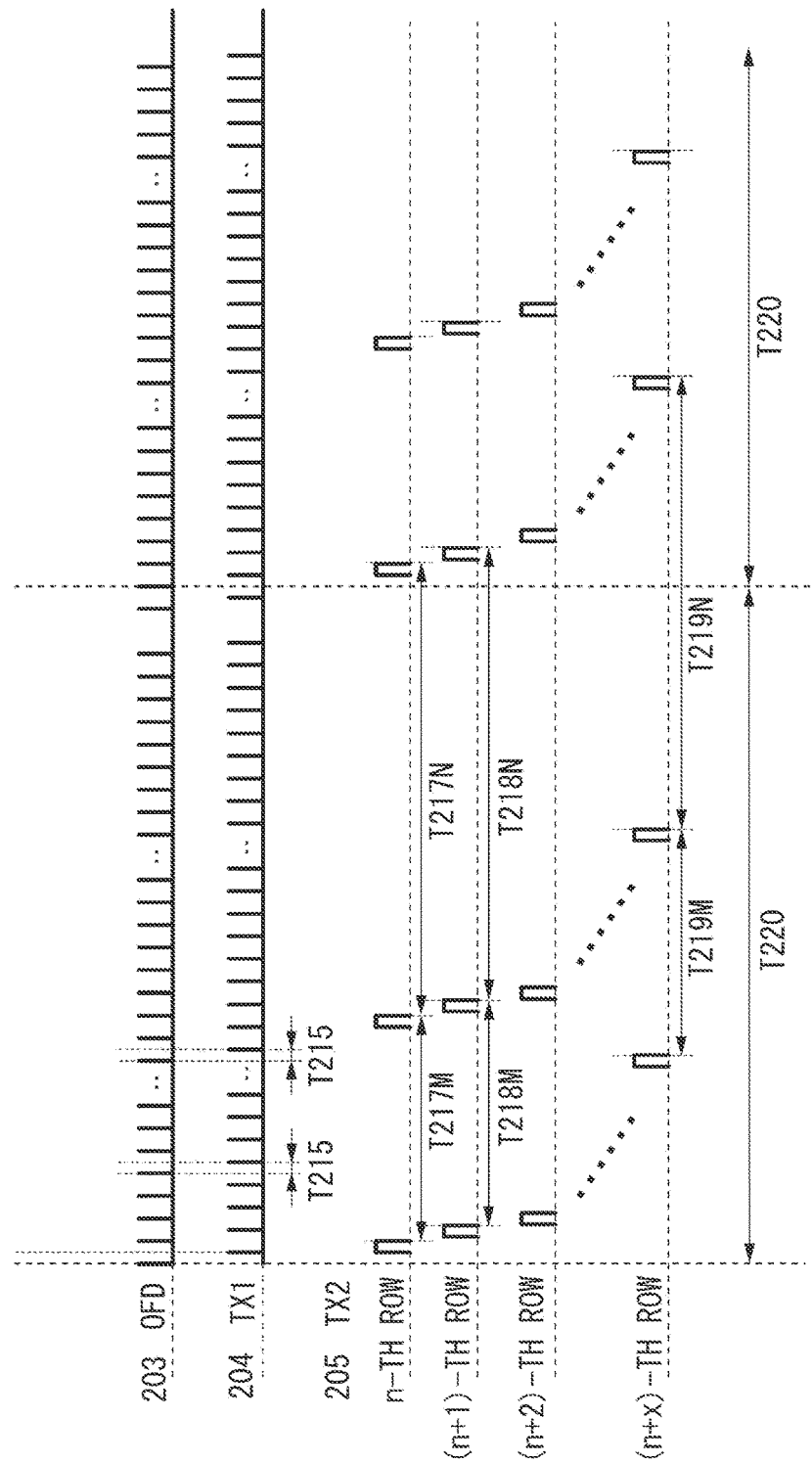
FIG. 9 is a timing chart illustrating driving of an imaging device according to a third exemplary embodiment.

FIG. 9 is a timing chart illustrating operations of the imaging device 101 according to the present exemplary embodiment. Similar to the first exemplary embodiment, the signal waveform 203 indicates a waveform of the pulse signal of the control line 323 of the discharge switch 318, and the signal waveform 204 indicates a waveform of the pulse signal of the control line 321 of the first transfer switch 304. According to the present exemplary embodiment, the discharge switch 318 is turned ON and OFF and the first transfer switch 304 is turned ON and OFF at the same timing for all pixels. This ensures synchronicity of sampling exposure for all pixels.

The signal waveform 205 indicates a waveform of the pulse signal of the control line 322 of the second transfer switch 305. FIG. 9 illustrates the signal waveform 205 for controlling the second transfer switch 305 provided in the n-th to (n+x)-th rows. As illustrated in FIG. 9, the pulse signal of the control line 322 of the second transfer switch 305 row-sequentially changes from the L level to the H level. Accordingly, the electric charges are row-sequentially transferred to the amplifying unit 310 from the charge holding unit 302.

The time period T215 indicates a time period during which the above-described sampling operation is performed once, which is performed a plurality of times. A time period T217M indicates a time period during which the electric charges are held by the charge holding unit 302 in the n-th row. The electric charges generated in the time period T217M are used as electric charges for forming an image with the short exposure time. A time period T217N also indicates a time period during which the electric charges are held by the charge holding unit 302 in the n-th row. The electric charges generated in the time period T217N are used as electric charges for forming an image with the long exposure time. The time periods T217M and T217N are equivalent to a time period since the first sampling operation starts until the last sampling operation ends, during which the sampling operation is performed a plurality of times. Also according to the present exemplary embodiment, as illustrated in FIG. 9, a plurality of sampling operations is performed during the time periods T217M and T217N.

Similarly, in each of other rows, as indicated by time periods T218M, T218N, T219M, T219N, etc., the electric charges for forming an image with the short exposure time and the electric charges for forming an image with the long exposure time are held by the charge holding unit 302. The electric charges added in the charge holding unit 302 are row-sequentially transferred to the amplifying unit 310, and image data is output from the output unit 106 to the image processing apparatus 710.

Employing the above-described configuration and driving method enables acquiring an image obtained by performing multi-exposure on the electric charges sampled a plurality of times by the charge holding unit 302. An image with a small number of times of multiplexing is an image with the short exposure time, and an image with a large number of times of multiplexing is an image with the long exposure time.

Therefore, two different types of images can be obtained. The configuration in which an image with an expanded dynamic range is obtained from these images is similar to that according to the second exemplary embodiment.

According to the present exemplary embodiment, synchronicity as in the second exemplary embodiment is not ensured for an image with the short exposure time and an image with the long exposure time. However, although each pixel includes only one charge holding unit, the above-described driving method enables acquiring images with different one-frame accumulation time periods. According to the present exemplary embodiment, changing the amount of sampling in the sampling exposure operation enables controlling the one-frame accumulation time period while maintaining the ratio of the exposure time of an image with the short exposure time to the exposure time of an image with the long exposure time.

A fourth exemplary embodiment will be described below centering on an example where the one-frame accumulation time period can be changed for each pixel row in the screen. The configuration of the imaging device 101 according to the present exemplary embodiment is similar to that illustrated in FIG. 3. An example of a configuration of the equivalent circuit of a pixel portion of the imaging device 101 according to the present exemplary embodiment is similar to that illustrated in FIG. 4.

Figure 10:
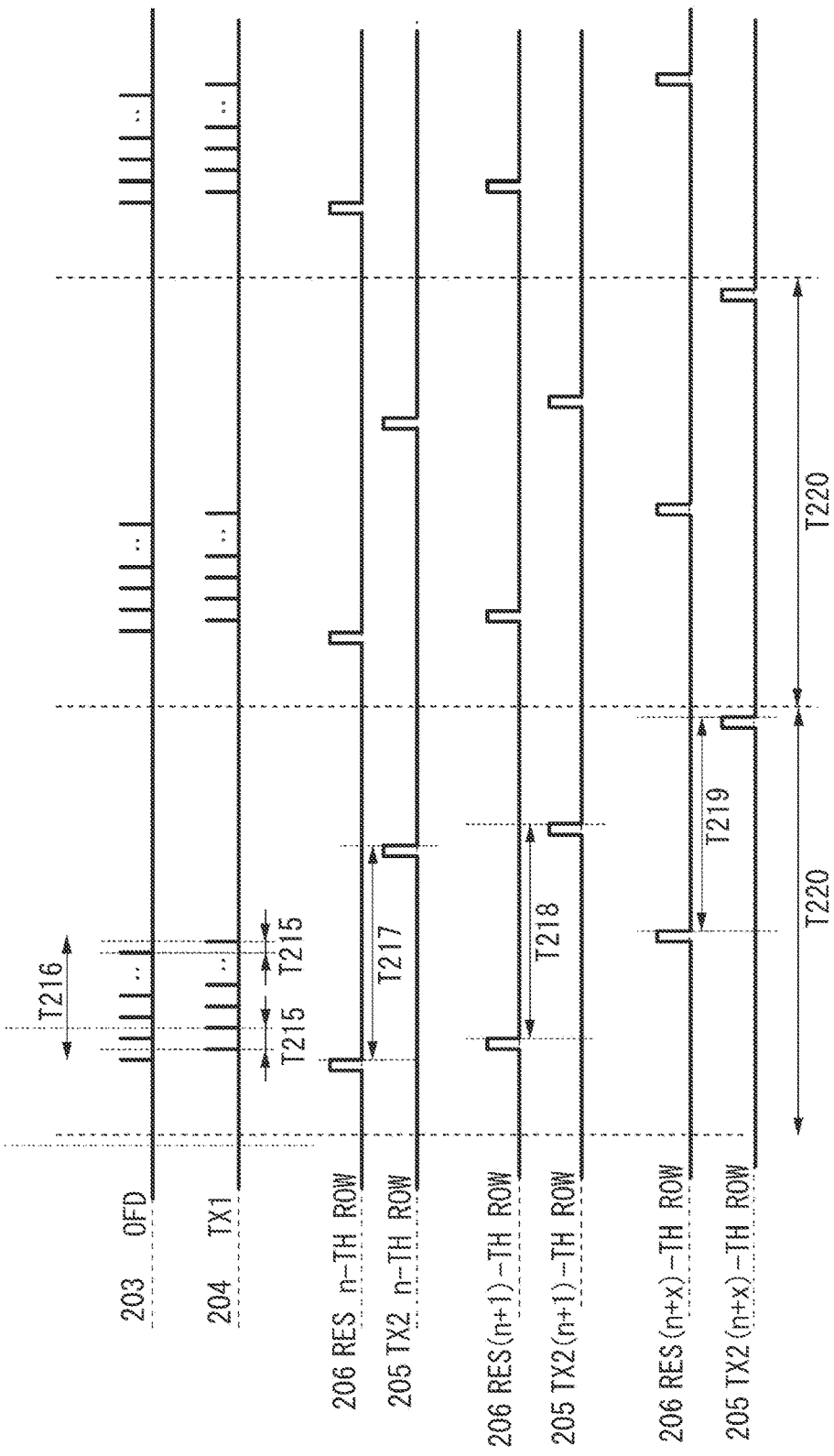
FIG. 10 is a timing chart illustrating driving of an imaging device according to a fourth exemplary embodiment.

FIG. 10 is a timing chart illustrating operations of the imaging device 101 according to the present exemplary embodiment, i.e., relationships between the signal waveforms 203, 204, and 205. The signal waveform 203 indicates a waveform of the pulse signal of the control line 323 of the discharge switch 318. The signal waveform 204 indicates a waveform of the pulse signal of the control line 321 of the first transfer switch 304. According to the present exemplary embodiment, the discharge switch 318 is turned ON and OFF and the first transfer switch 304 is turned ON and OFF at the same timing for all pixels, ensuring synchronicity of sampling exposure for all pixels.

The signal waveform 205 indicates a waveform of the pulse signal of the control line 322 of the second transfer switch 305. FIG. 10 illustrates the signal waveforms 205 for controlling the second transfer switches 305 provided in the n-th to (n+x)-th rows. As illustrated in FIG. 10, the pulse signal of the control line 322 of the second transfer switch 305 row-sequentially changes from the L level to the H level. Accordingly, the electric charges are row-sequentially transferred from the charge holding unit 302 to the amplifying unit 310.

A signal waveform 206 indicates a waveform of the pulse signal of the control line of a switch (not illustrated) for resetting the potential of the charge holding unit 302. For example, this reset switch is composed of a Metal Oxide Semiconductor (MOS) transistor. When this switch turns ON, the potential of the charge holding unit 302 reset to the potential of the reset line 326.

The time period T215 indicates a time period (sampling period) from the start to the end of one charge accumulation. A time period T216 indicates a time period during which the sampling operations are performed within a time period equivalent to one frame. The driving method according to the present exemplary embodiment differs from that according to the above-described exemplary embodiments in that a time period during which the sampling operations are performed is a part of a time period equivalent to one frame.

The time period T217 is a time period since the time when the potential of the charge holding unit 302 of the pixel in the n-th row is reset till the time when the second transfer switch 305 having been maintained to OFF turns ON. The time period T217 is also a time period during which the signal having undergone multi-exposure in the charge holding unit 302 is accumulated.

Similarly, the time period T218 is a time period since the time when the potential of the charge holding unit 302 of the pixel in the (n+1)-th row is reset until the time when the second transfer switch 305 turns ON. Further, the time period T219 is a time period since the time when the potential of the charge holding unit 302 of the pixel in the (n+x)-th row is reset until the time when the second transfer switch 305 turns ON.

In the driving method according to the present exemplary embodiment, in the pixel in the n-th row, the electric charges sampled within a time period during which the time periods T216 and T217 overlap with each other are held by the charge holding unit 302. On the other hand, in pixel in the (n+x)-th row, the electric charges sampled within a time period during which the time periods T216 and T219 overlap with each other are held by the charge holding unit 302.

More specifically, according to the present exemplary embodiment, a time period during which the sampling operations are performed is a part of a time period equivalent to one frame. The timing of resetting the charge holding unit 302 and the timing of transferring the electric charges from the charge holding unit 302 to the amplifying unit 310 are different for each row. Therefore, each pixel row has a different amount of charges multiplexed by the charge holding unit 302. Since the amount of charges multiplexed by the sampling operation differs for each row in the screen, the amount of exposure in the screen can be changed in the vertical scanning direction (column direction). For example, with an on-vehicle camera, the upper part of a desired imaging region irradiated with sunlight may become a bright region while the lower part, which is hardly irradiated with sunlight may possibly become a dark region. Therefore, the use of the driving method according to the present exemplary embodiment enables acquiring a suitable image since the amount of exposure can be changed. Further, even in a case where only the lower part and the center of the desired imaging region are bright, a suitable image can be acquired by suitably adjusting the drive timing of each switch.

To change the absolute value of the amount of exposure without changing the ratio of change of the amount of exposure in the vertical scanning direction in the screen, it is only necessary to increase or decrease the amount of charges to be exposed in one sampling operation. To accomplish this, the sampling width, the sampling interval determined by the signal waveforms 203 and 204 need to be changed. To change the ratio of change of the amount of exposure in the screen without largely changing the absolute value of the amount of exposure, it is only necessary to change the degree of overlapping between the time period T216 and a time period (for example, the time period T217) during which the electric charges are held by the charge holding unit in each pixel row.

Control of the sampling interval, the sampling width, and the number of times of sampling is performed independently of sampling charge multiplexing control performed in each row in this way, making it possible to control the amount of exposure in the screen in the imaging device.

<Other Exemplary Embodiments>

The present invention is not limited to the above-described exemplary embodiment but can be suitably modified and combined.

The length of the H level or L level of signal waveforms according to each exemplary embodiment can be suitably changed. For example, according to the second exemplary embodiment, as for the drive pulse of a first transfer switch, the length of the time period for the H level when acquiring a signal with the long exposure time is longer than the length of the time period for the H level when acquiring a signal with the short exposure time. However, with the same length of the time periods for the H level or with the inverted length relation between them, the length of the exposure time period may be changed by changing the number of times of transferring the electric charges from the photoelectric conversion unit 301 to a charge holding unit.

The imaging system according to the second exemplary embodiment can also be configured by combining the imaging device according to each exemplary embodiment with an image processing apparatus.

In addition, the imaging device and the imaging system according to the present invention can be applied to small-sized unmanned moving bodies, various types of robots, portable apparatuses, on-vehicle cameras, monitoring cameras, industrial cameras, and other apparatuses for performing image recognition in various scenes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-237864, filed Dec. 4, 2015, which is hereby incorporated by reference herein in its entirety.

What is claimed is:

1. An imaging device comprising:
a plurality of pixels arranged in rows and columns, each of the plurality of pixels including a photoelectric conversion unit configured to accumulate electric charges generated by incident light, a holding unit configured to hold the electric charges, an amplifying unit configured to output a signal based on the electric charges, a first transfer switch configured to transfer the electric charges from the photoelectric conversion unit to the holding unit, and a second transfer switch configured to transfer the electric charges from the holding unit to the amplifying unit;
output lines configured to output signals from the amplifying unit of the plurality of pixels; and
a control unit configured to execute the following operations:
a first transfer operation of transferring charges accumulated in a first charge accumulation period from the photoelectric conversion unit to the holding unit by simultaneously turning on the first transfer switches of a first pixel row and a second pixel row different from the first pixel row while maintaining the second transfer switches of the first pixel row and the second pixel row in the OFF state,
a first reading out operation of transferring the charges accumulated in the first charge accumulation period from the holding unit to the amplifying unit by turning on the second transfer switch of the first pixel row, after the first transfer operation,
a second transfer operation of transferring charges accumulated in a second charge accumulation period from the photoelectric conversion unit to the holding unit by simultaneously turning on the first transfer switches of the first pixel row and the second pixel row while maintaining the second transfer switches of the first pixel row and the second pixel row in the OFF state, after the first reading out operation, and
a second reading out operation of transferring the charges accumulated in the second charge accumulation period from the holding unit to the amplifying unit by turning on the second transfer switch of the second pixel row, after the second transfer operation,
wherein the second transfer switch of the second pixel row is maintained in the OFF state from the first reading out operation to the second reading out operation.

2. The imaging device according to claim 1,
wherein each of the plurality of pixels has a discharge switch for discharging the electric charges accumulated in the photoelectric conversion unit, and
wherein the control unit performs control to turn OFF the discharge switch of a plurality of the pixels at a time when the first transfer switch is intermittently turned on a plurality of times.

3. The imaging device according to claim 1, wherein the control unit performs control to turn OFF the second transfer switch of the plurality of pixels at a time when the first transfer switch is intermittently turned on a plurality of times.

4. The imaging device according to claim 1, wherein each of the plurality of pixels comprises:
a first holding unit and a second holding unit as the holding unit;
the first transfer switch configured to transfer the electric charges from the photoelectric conversion unit to the first holding unit;
the second transfer switch configured to transfer the electric charges from the first holding unit to the amplifying unit;
a third transfer switch configured to transfer the electric charges from the photoelectric conversion unit to the second holding unit; and
a fourth transfer switch configured to transfer the electric charges from the second holding unit to the amplifying unit,
wherein, for each of the plurality of pixels arranged in a plurality of rows among the plurality of pixels, the control unit performs control to intermittently turn on the third transfer switch at the same timing a plurality of times to intermittently transfer the electric charges from the photoelectric conversion unit to the second holding unit a plurality of times, and performs control to row-sequentially turn on the fourth transfer switch of a plurality of the pixels to transfer the electric charges held by the second holding unit, transferred a plurality of times, to the amplifying unit on a row basis, and
wherein an amount of the electric charges held by the first holding unit and transferred a plurality of times, is different from an amount of the electric charges held by the second holding unit, transferred a plurality of times.

5. The imaging device according to claim 4, wherein a length of a time period during which the first transfer switch is intermittently turned on is different from a length of a time period during which the third transfer switch is intermittently turned on, or the number of times of transferring the electric charges from the photoelectric conversion unit to the first holding unit by turning on the first transfer switch a plurality of times is different from the number of times of transferring the electric charges from the photoelectric conversion unit to the second holding unit by turning on the third transfer switch a plurality of times.

6. The imaging device according to claim 4, wherein the control unit performs control so that a time period during which the first transfer switch is turned on does not overlap with a time period during which the third transfer switch is turned on.

7. The imaging device according to claim 4, wherein the control unit performs control so that a time when the second switch is turned on is different from a time when the fourth transfer switch is turned on.

8. The imaging device according to claim 1, wherein, in at least one pixel out of the plurality of pixels, the control unit has a first holding period for holding the electric charges transferred a plurality of times by the holding unit while maintaining the second transfer switch to OFF, and a second holding period for holding the electric charges transferred a plurality of times by the holding unit while maintaining the second transfer switch to OFF after the first holding period, and wherein the control unit performs control so that the number of times of turning on the first transfer switch in the first holding period is different from the number of times of turning on the first transfer switch in the second holding period.

9. The imaging device according to claim 1, wherein the plurality of pixels includes a first pixel and a second pixel, and wherein the control unit performs control so that an amount of charges held by the holding unit of the first pixel in a time period since a time when a potential of the holding unit of the first pixel is reset till a time when the second switch of the first pixel is turned on is different from an amount of charges held by the holding unit of the second pixel in a time period since a time when a potential of the holding unit of the second pixel is reset till a time when the second switch of the second pixel is turned on.

10. The imaging device according to claim 9, wherein the control unit performs control so that a time period during which the first transfer switch is intermittently turned on at a same timing a plurality of times is shorter than a one-frame period.

11. The imaging device according to claim 1, wherein, the control unit performs control so that, in the plurality of pixels, an interval at which the first transfer switch is intermittently turns on at a same timing a plurality of times is a half or less of a blinking cycle of a light source.

12. The imaging device according to claim 1, in at least one pixel out of the plurality of pixels, the control unit performs control so that a time period during which the electric charges are held by the holding unit is longer than a blinking cycle of a light source.

13. The imaging device according to claim 1, wherein the control unit includes a first pulse generation unit for generating a pulse for controlling the first transfer switch and a second pulse generation unit for generating a pulse for controlling the second transfer switch.

14. The imaging device according to claim 1, wherein a beginning of the first charge accumulation period is specified by turning off the second transfer switch of the first pixel row.

15. The imaging device according to claim 1, wherein a beginning of the first charge accumulation period is specified by turning off a reset switch.

16. An imaging system comprising:

the imaging device according to claim 1; and an image processing apparatus configured to process input image data output from the imaging device.

* * * * *